United States Patent
Yaguchi et al.

(10) Patent No.: US 8,866,986 B2
(45) Date of Patent: Oct. 21, 2014

(54) DISPLAY DEVICE WITH SUPPORT MEMBER HAVING TWO LUGS

(75) Inventors: Tomio Yaguchi, Sagamihara (JP); Yasushi Nakano, Tokyo (JP); Hitoshi Azuma, Yokohama (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 435 days.

(21) Appl. No.: 12/836,714

(22) Filed: Jul. 15, 2010

(65) Prior Publication Data

US 2011/0013112 A1    Jan. 20, 2011

(30) Foreign Application Priority Data

Jul. 16, 2009   (JP) ................................. 2009-168085

(51) Int. Cl.
  *G02F 1/1333*   (2006.01)
  *G02F 1/133*    (2006.01)
  *G02F 1/1347*   (2006.01)

(52) U.S. Cl.
  CPC .... *G02F 1/133305* (2013.01); *G02F 1/133308* (2013.01)
  USPC .......................................................... 349/58

(58) Field of Classification Search
  USPC .......................................... 349/58, 60, 73, 74
  See application file for complete search history.

(56) References Cited

U.S. PATENT DOCUMENTS

| 2002/0047952 A1 | 4/2002 | Kawata |
| 2007/0146616 A1* | 6/2007 | Nouchi et al. ................ 349/155 |
| 2009/0015747 A1* | 1/2009 | Nishizawa et al. ............. 349/58 |

FOREIGN PATENT DOCUMENTS

| JP | 06-347772 | 12/1994 |
| JP | 10-268269 | 10/1998 |
| JP | 2002-49021 | 2/2002 |
| JP | 2002-184959 | 6/2002 |
| JP | 2010-078887 | 4/2010 |

* cited by examiner

*Primary Examiner* — Lauren Nguyen
(74) *Attorney, Agent, or Firm* — Antonelli, Terry, Stout & Kraus, LLP.

(57) ABSTRACT

In a display device which includes a display panel in which a plurality of pixels are arranged on a substrate two-dimensionally and which is configured to display an image thereon, and a support member which supports the display panel, the support member possesses anisotropy in bending strength so as to encourage one-dimensional deformation (bending along only the X direction) of the display panel while suppressing two-dimensional deformation (bending in the X direction as well as in the Y direction) of the display panel.

18 Claims, 6 Drawing Sheets

DISPLAY DEVICE WITH SUPPORT MEMBER HAVING TWO LUGS

CROSS-REFERENCE TO RELATED APPLICATION

The present application claims priority from Japanese application JP 2009-168085 filed on Jul. 16, 2009, the content of which is hereby incorporated by reference into this application.

BACKGROUND OF THE INVENTION

1. Field of the Invention

The present invention relates to a display device, and more particularly to a display device using a substrate which is liable to be deformed two-dimensionally such as a plastic substrate or a thin glass substrate.

2. Description of the Related Art

Various kinds of display devices such as a liquid crystal display device and an organic EL display device have been put into practice. Further, mobile phones and personal digital assistants which incorporate these display devices also have been provided. In display devices developed and used in recent years, to enhance the reduction of thickness, to enhance the reduction of weight or to increase the flexibility of the display device, a substrate which constitutes a part of the display device is formed using a plastic substrate or a thin glass substrate.

With respect to a display device which uses a plastic substrate, as disclosed in JP-A-2002-184959 (patent document 1) or the like, there has been proposed a flexibly deformable display device in which functional elements such as thin film transistors (TFTs) are formed on a glass substrate and, thereafter, glass is removed or the glass substrate is formed into a thin film, and functional elements are adhered to (or transferred to) a plastic substrate.

However, to use the plastic substrate in the display device such as a liquid crystal display device or an organic EL display device, the plastic substrate is required to possess high size stability (low thermal expansion property or high heat resistant property) and hence, the plastic substrate exhibits characteristics that the plastic substrate exhibits high resistance against bending but is liable to be broken when elongation deformation is applied to the plastic substrate. In fact, when a liquid crystal display panel which uses a plastic substrate is deformed, the liquid crystal display panel has a drawback that although the liquid crystal display panel exhibits high flexibility with respect to one-dimensional bending (one-dimensional deformation) such as a four-point bending test, the liquid crystal display panel is liable to be broken with respect to a point load which easily causes the two-dimensional bending (two-dimensional deformation) of the liquid crystal display panel such as a load falling test. Even when the liquid crystal display panel uses a thin glass substrate which is made thin enough to be bendable, in the same manner as the plastic substrate, the liquid crystal display panel exhibits more brittleness against the two-dimensional deformation than one-dimensional deformation.

SUMMARY OF THE INVENTION

The present invention has been made to overcome the above-mentioned drawbacks, and it is an object of the present invention to provide a display device which can prevent a display panel from being broken even when a substrate which constitutes the display panel is formed of a substrate which is brittle to two-dimensional deformation.

To overcome the above-mentioned drawbacks, the display device according to the present invention is characterized by following constitutions.

(1) According to one aspect of the present invention, there is provided a display device which includes a display panel in which a plurality of pixels are arranged on a substrate two-dimensionally and which is configured to display an image thereon, and a support member which supports the display panel, wherein the support member possesses anisotropy in bending strength so as to encourage one-dimensional deformation of the display panel while suppressing two-dimensional deformation of the display panel.

(2) In the display device having the constitution described in (1), the support member is a frame member which is configured to support only two opposite sides of the display panel.

(3) In the display device having the constitution described in (2), the frame member is provided with a folded portion which projects toward a side where the display panel is arranged at portions thereof outside positions where two sides of the display panel are supported.

(4) In the display device having the constitution described in (1), the support member is a casing member which houses the display panel, an optical sheet and a backlight member.

(5) In the display device having the constitution described in (4), the casing member includes a bottom surface, and two side surface support portions which are formed on edge portions of the bottom surface by being bent from the bottom surface such that the side surface support portions support two opposite sides of the display panel.

(6) In the display device having the constitution described in (5), a plurality of grooves which are arranged parallel to the side surface support portions are formed on the bottom surface of the casing member.

(7) In the display device having the constitution described in (5) or (6), a plurality of auxiliary support portions which are bent from the bottom surface and support portions of two other sides of the display panel different from two opposite sides of the display panel are formed on the edge portions on a side where the side surface support portions are not formed out of the edge portions of the bottom surface.

(8) In the display device having the constitution described in (1), the support member has a support surface which overlaps with the display panel as viewed in a plan view, and the support member is a back surface support member which supports a back surface of the display panel on a side opposite to a display screen of the display panel by the support surface.

(9) In the display device having the constitution described in (8), the back surface support member has a plurality of beams which are arranged parallel to two opposite sides of the display panel.

(10) In the display device having the constitution described in (9), the beams are formed on the back surface support member on a side opposite to a side where the display panel is arranged on the support surface.

(11) In the display device having the constitution described in (8), the back surface support member has a plurality of grooves which are arranged parallel to two opposite sides of the display panel on the support surface.

(12) In the display device having the constitution described in (8), a recessed portion whose thickness is continuously changed in the direction perpendicular to two opposite sides of the display panel is formed on the support surface.

(13) In the display device having the constitution described in (12), the recessed portion is formed on the back surface support member on a side opposite to a side where the display panel is arranged on the support surface.

According to the present invention, even when an external force such as a point load which causes the two-dimensional deformation is applied to a display panel, a support member which supports the display panel is deformed so as to suppress the two-dimensional deformation and accelerate the one-dimensional deformation of the display panel and hence, it is possible to prevent the display panel from being broken. Further, since the breaking of the display panel can be prevented, it is possible to enhance the mechanical strength of the whole display device.

DETAILED DESCRIPTION OF THE INVENTION

Figure 5:
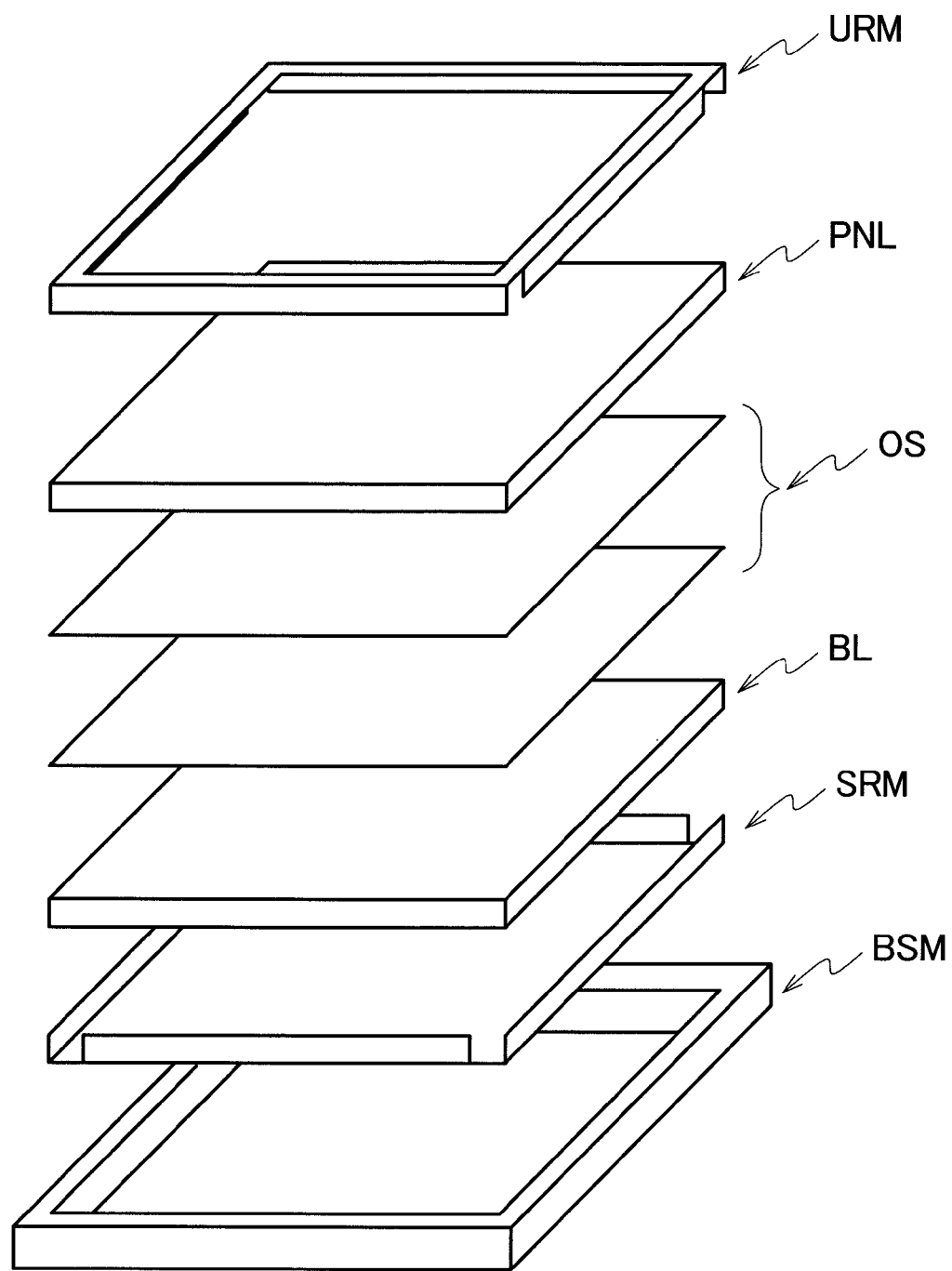
FIG. 5 is a view for explaining the constitution of a liquid crystal display device which is one example of the display device.

Hereinafter, a display device according to the present invention is explained in detail. FIG. 5 is a view for explaining the constitution of a liquid crystal display device which is one example of the display device according to the present invention. Hereinafter, the explanation is made by focusing on the liquid crystal display device. However, the display device of the present invention is not limited to the liquid crystal display device, and is applicable to an organic EL display device or the like. Particularly, the present invention is preferably applicable to a display device which uses a plastic substrate or a thin glass substrate as a display panel.

The liquid crystal display device shown in FIG. 5 includes: a liquid crystal display panel PNL; a backlight BL; and an optical sheet OS for making an illumination light radiated from the backlight BL to the whole liquid crystal display panel PNL uniform. The optical sheet OS is constituted of a prism sheet and a diffusion sheet. The backlight BL is constituted of a light source formed of a light emitting diode (LED), a light guide plate, a reflection sheet and the like, for example. These parts are integrally held by an upper frame member URM, a lower frame member SRM and a back surface support member BSM. Further, there may be a case where the back surface support member BSM is omitted and the lower frame member SRM also functions as a back surface support member or a case where the upper frame member URM is omitted and a casing member is formed by adding the support structure for a display panel to a portion of the lower frame member SRM.

The liquid crystal display panel has the structure where liquid crystal is sealed in a space defined between two substrates, and a thin film transistor (TFT) layer, a color filter layer and the like are formed on inner surfaces of the substrates. Usually, when the substrate is formed of a glass plate having a thickness of approximately 500 μm, the glass substrate per se possesses high rigidity and hence, the substrate is hardly deformed whereby there is no possibility that the substrate is broken by deformation thereof particularly. However, when the substrate is formed of a plastic substrate, a thin glass substrate having a thickness of 100 μm or less or a composite substrate of a plastic substrate and a thin glass substrate, the substrate is liable to be deformed. Particularly, the substrate is easily broken by the two-dimensional deformation attributed to a point load or the like.

The liquid crystal display panel PNL is laminated to the optical sheet OS and backlight BL using an adhesive layer or the like and, at the same time, as shown in FIG. 5, is structurally fixed using the frame members and the casing member. Accordingly, conventionally, by improving a connection portion between the frame members and the display panel or improving the structure of the casing member, the deformation of the display device is restricted so as to prevent the display panel from being broken.

However, as a result of extensive studies made by inventors of the present invention, the inventors have found that, rather than preventing all deformations, by suppressing the generation of two-dimensional deformation and by limiting the deformation to one-dimensional bending even when a point load is applied to the display panel, the elongation and shrinkage of the display panel become the circumference difference dependent on a plate thickness of the substrate and hence, the substrate is hardly broken. The present invention is made based on such finding.

In the display device of the present invention which includes: the display panel in which a plurality of pixels are arranged on a substrate two-dimensionally and is configured to display an image thereon; and a support member which supports the display panel, the improvement is characterized in that the support member possesses anisotropy in bending strength (strength anisotropy) so as to encourage one-dimensional deformation while suppressing two-dimensional deformation of the display panel.

The "strength anisotropy" in the present invention implies that bending strength of the support member with respect to an external force applied to the support member differs depending on the bending direction. To be more specific, "strength anisotropy" implies the structure in which easily bendable direction is intentionally imparted to a die-cast member such as the frame member exemplified by the upper frame member and the lower frame member constituting the support member and the back surface support member.

Hereinafter, the explanation is made with respect to embodiments where the present invention is applied to various kinds of support members.

Figure 1:
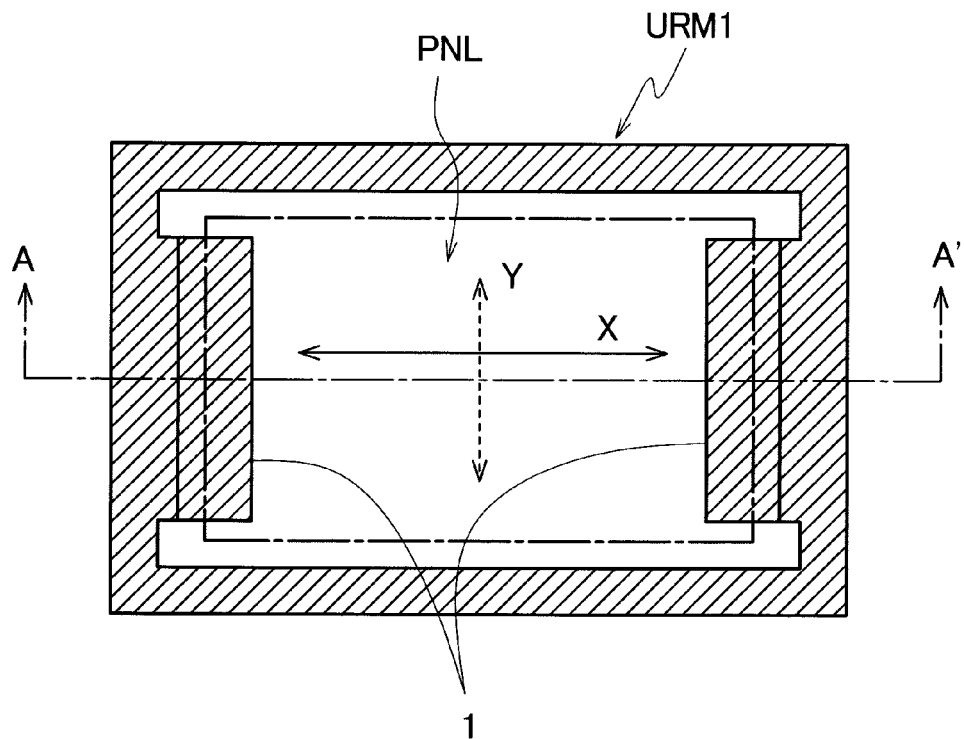
FIG. 1 is a plan view for explaining an embodiment of a display device which uses a frame member as a support member.

FIG. 1 is a view showing an embodiment in which the present invention is applied to a frame member which is one of the support members, and more particularly to an upper frame member URM1. Different from the upper frame member URM shown in FIG. 5 which covers the liquid crystal display panel PNL together with the optical sheet OS and the backlight BL, with respect to the upper frame member URM1 shown in FIG. 1, the liquid crystal display panel PNL is arranged on an upper surface of the upper frame member URM1. The upper frame member URM1 which supports the display panel PNL indicated by a chained line has support lugs 1 which support only two opposite sides of the display panel PNL. Further, the display panel PNL is fixed to the support lugs 1 using an adhesive agent or the like.

Figure 2A:
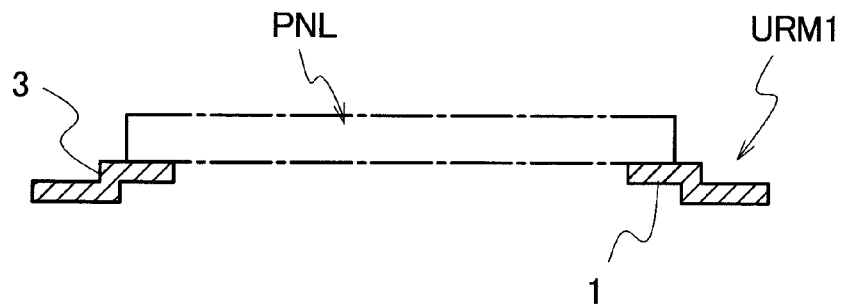
FIG. 2A and FIG. 2B are cross-sectional views taken along a chain double-dashed line A-A' in FIG. 1.
Figure 2B:
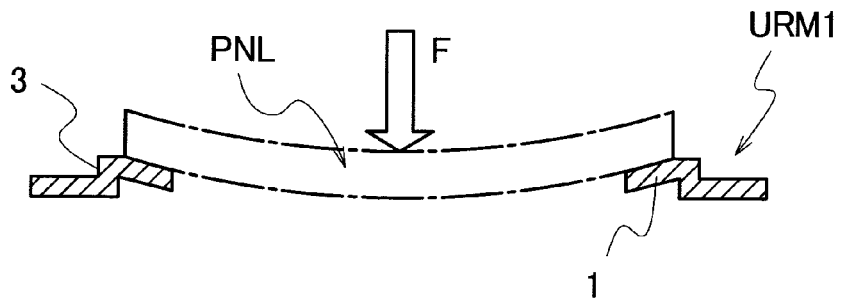

FIG. 2A and FIG. 2B are cross-sectional views taken along a chain double-dashed line A-A' in FIG. 1. FIG. 2A and FIG. 2B show a state where the upper frame member URM1 supports the display panel PNL, wherein FIG. 2A shows a state where a load such as an external force is not applied to the display panel PNL, and FIG. 2B shows a state where an external force F is applied to the display panel PNL so that the display panel PNL is deformed one-dimensionally.

As shown in FIG. 1, FIG. 2A and FIG. 2B, by adopting the structure where the support structure for supporting the display panel PNL on the upper frame member URM1 is provided to only two opposite sides of the display panel PNL, it is possible to provide the structure which allows the display panel PNL to perform only one-dimensional deformation in FIG. 2B where the display panel PNL is bent only vertically. In such support structure, due to the structure of the upper frame member URM1 which uses the support lugs 1, the display panel PNL is hardly bent in the direction parallel to two supported sides (Y direction in FIG. 1), while only small resistance is generated in the display panel PNL in the direction perpendicular to the supported sides (X direction in FIG. 1) so that the display panel PNL is easily bent in the X direction. Accordingly, it is possible to impart bending strength anisotropy to the display panel PNL. Particularly, by forming bent portions 3 (stepped portions shown in FIG. 2) which are arranged parallel to the support lugs 1 on the upper frame member URM1 in the vicinity of support portions of the upper frame member URM1, the display panel PNL is hardly bent in the Y direction so that it is possible to impart higher strength anisotropy to the display panel PNL. Here, the structure for supporting the display panel PNL is not limited to the upper frame member. That is, for example, the structure according to the present invention may be applied to a frame-shaped member (middle frame, mold frame) not shown in FIG. 5 which supports the display panel PNL from an optical sheet OS side and a backlight BL side respectively.

Figure 3:
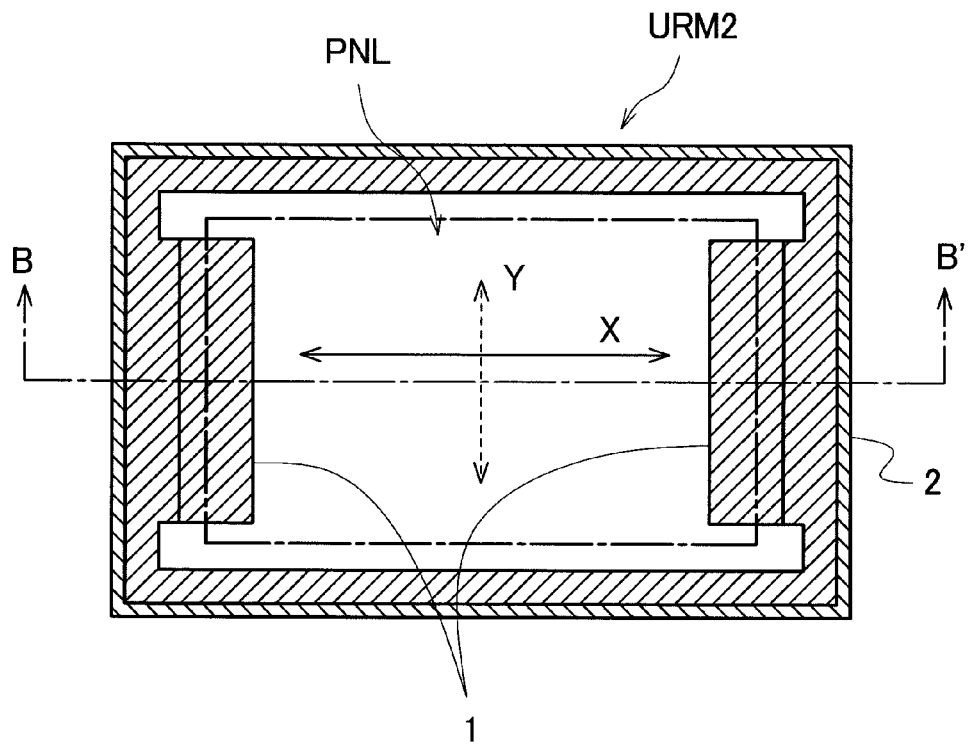
FIG. 3 is a plan view for explaining an embodiment of the display device using a frame member which can suppress the deformation as a support member.
Figure 4A:
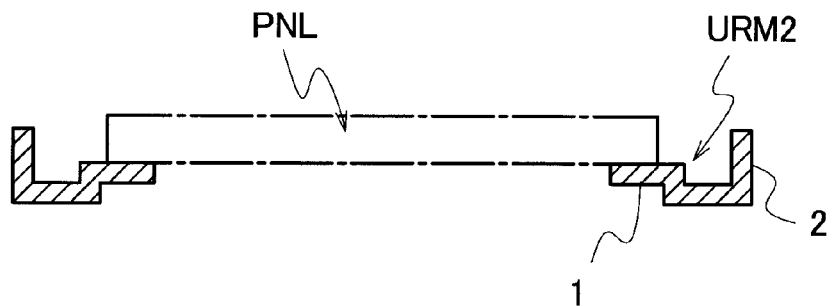
FIG. 4A and FIG. 4B are cross-sectional views taken along a chain double-dashed line B-B' in FIG. 3.
Figure 4B:
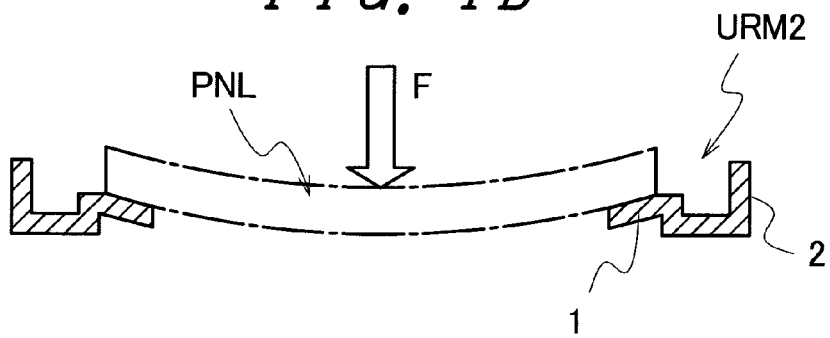

FIG. 3, FIG. 4A and FIG. 4B show another embodiment of the present invention where an upper frame member is used as the support member. To be more specific, FIG. 3 and FIG. 4 show the structure where the deformation of an upper frame member per se is suppressed. FIG. 4A and FIG. 4B are cross-sectional views taken along a chain double-dashed line B-B' in FIG. 3. This embodiment is characterized in that a folded portion 2 which projects toward a side where the display panel PNL is arranged is formed on portions of the upper frame member URM2 arranged around support lugs 1 respectively so that the deformation of the frame member per se is suppressed.

By constituting the upper frame member URM2 so as to prevent the deformation of the fame structure and to allow only the support lugs 1 to be deflected by an external force F, the deformation of the display panel PNL in the Y direction in FIG. 3 can be surely suppressed thus allowing the display panel PNL to be deformed only in the X direction. Further, as another method for preventing the deformation of the frame structure, a thickness of a peripheral portion of the frame may be increased. Since it is often the case that the frame member, the casing member or the like described later is formed by press forming, it is easier to adjust the strength of the frame structure by the folded structure which is formed by folding or the like.

Figure 6:
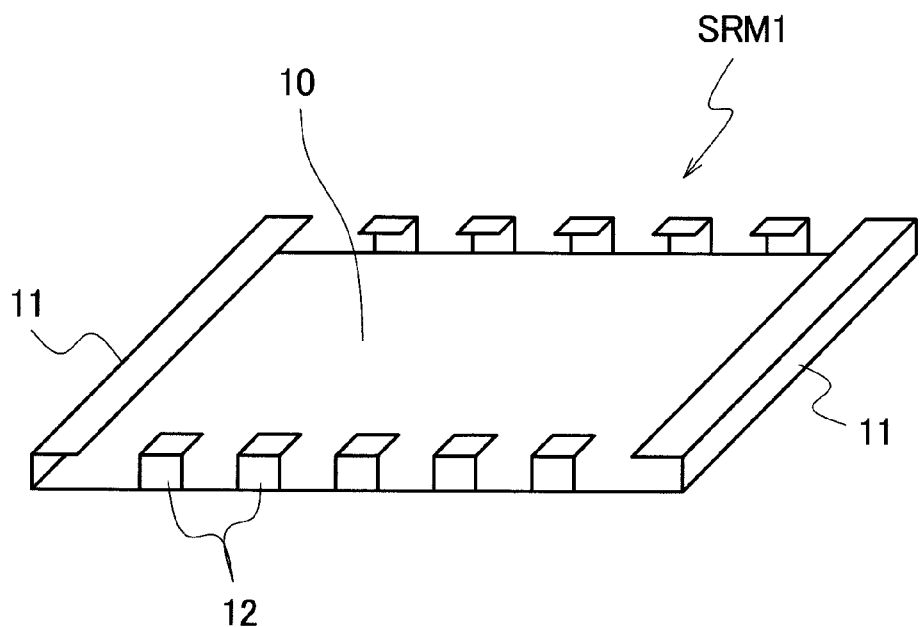
FIG. 6 is a perspective view for explaining an embodiment where a casing member is used as a support member of the display device.
Figure 7:
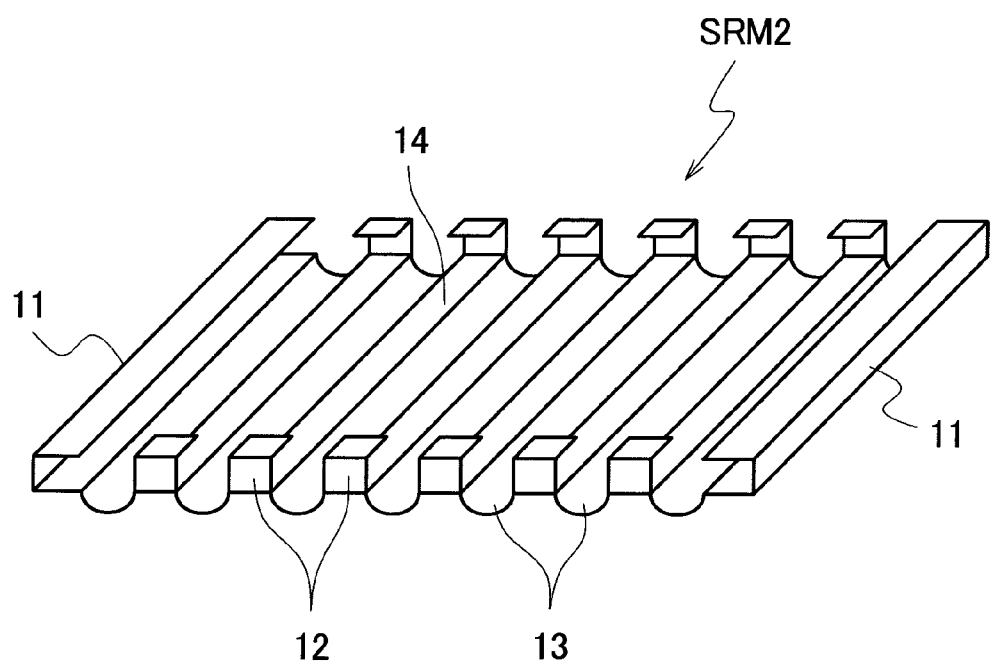
FIG. 7 is a perspective view for explaining another embodiment where a casing member is used as a support member of the display device.

FIG. 6 and FIG. 7 show the improvement of the lower frame member SRM shown in FIG. 5 where the lower frame member SRM is constituted of a casing member having strength anisotropy. A casing member SRM1 is a casing member which covers a display panel. The display panel, an optical sheet and a backlight not shown in the drawing are housed in the inside of the casing member SRM1. The casing member SRM1 includes integrally-formed folded portions (side surface support portions 11) at portions thereof corresponding to only two opposite sides of the display panel.

The side surface support portion 11, in the same manner as the frame member shown in FIG. 1 to FIG. 4, supports the display panel by fixing such as adhesion. In a case where the display panel is deflected by its own weight, as shown in FIG. 6, it is preferable to provide auxiliary support portions 12 which support the display panel at intervals at positions other than the sides on which the side surface support portion 11 is formed. Such auxiliary support portions 12 are not continuously formed and hence, the display panel can be easily bent in the arrangement direction of the auxiliary support portions 12 (in the lateral direction in FIG. 6) thus assisting the one-dimensional deformation of the display panel.

A casing member SRM2 in FIG. 7 is configured such that a plurality of grooves 13 are formed on a bottom surface 10 of the casing member SRM1 in FIG. 6, and a bottom surface of the casing member SRM2 is constituted of planar portions 14 and a plurality of grooves 13. Since the grooves 13 are formed parallel to the side surface support portions 11, the casing member SRM2 is characterized by being hardly bent in the direction along the grooves 13 and being easily bent in the direction perpendicular to the grooves 13 (in the lateral direction in FIG. 7) with respect to the whole bottom surface of the casing member SRM2. Due to such a constitution, it is possible to impart strength anisotropy to the casing member SRM2 which constitutes the support member. Here, in the same manner as the constitution shown in FIG. 6, the casing member SRM2 in FIG. 7 may also include auxiliary support portions 12.

Next, the explanation is made with respect to an embodiment in which strength anisotropy is imparted to a back-surface support member which supports a display panel from a back surface side. For example, the back-surface support member BSM shown in FIG. 5 includes a support surface which supports the display panel PNL and overlaps with the display panel PNL as viewed in a plan view. The back-surface support member BSM mounts the display panel PNL, the optical sheet OS and the backlight BL thereon, and supports a back surface of the display panel PNL on a side opposite to a display screen of the display panel PNL by the support surface thereof. Such a back-surface support member is formed by a die-casting manufacturing method using a magnesium alloy or the like as a material. In the present invention, a thickness of the back-surface support member is adjusted to impart strength anisotropy to the back-surface support member, as shown in FIG. 8 to FIG. 11.

Figure 8:
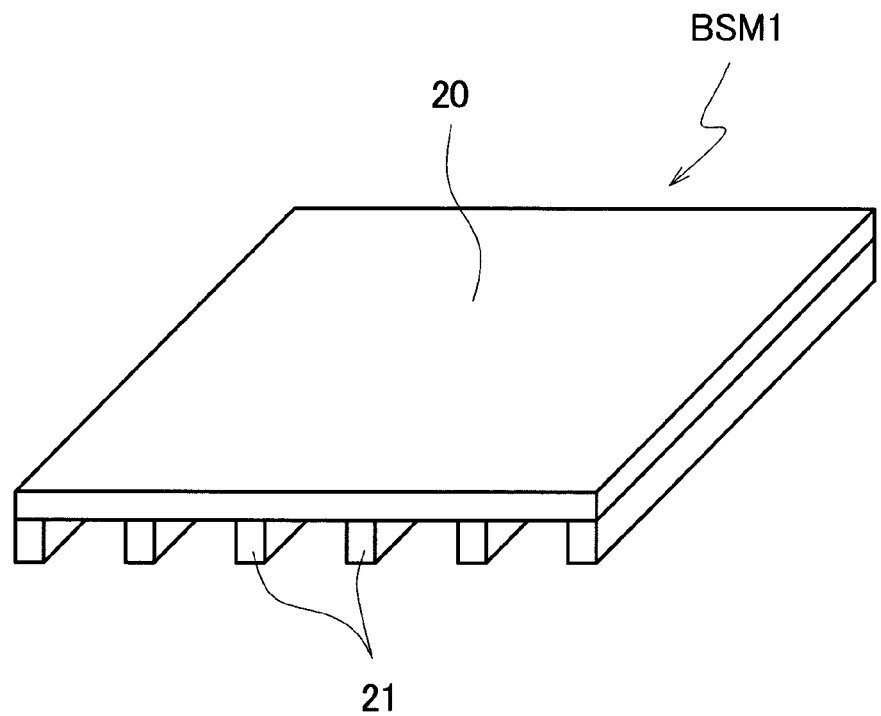
FIG. 8 is a perspective view for explaining an embodiment where a back surface support member possessing strength anisotropy due to a plurality of beams is used as a support member.
Figure 9:
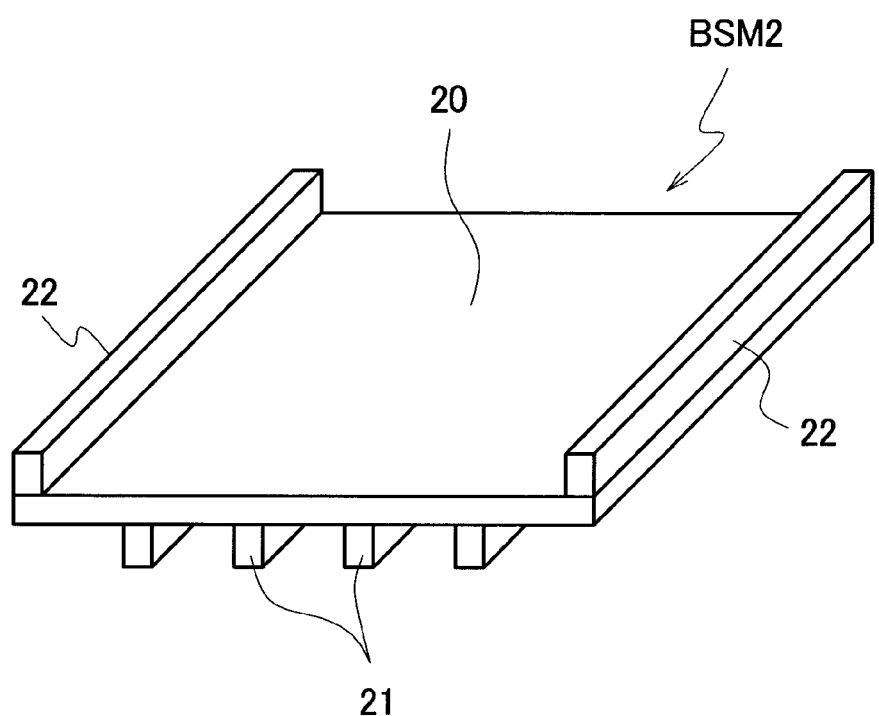
FIG. 9 is a perspective view for explaining another embodiment where a back surface support member possessing strength anisotropy due to a plurality of beams is used as a support member.

In FIG. 8 and FIG. 9, the back-surface support members BSM1 and BSM2 respectively have the structure where a plurality of beams 21 (beam structure) are arranged parallel to two opposite sides of the display panel (not shown in the drawings). By forming the back surface support member by combining a planar plate portion 20 which constitutes a support surface and the beams 21 with each other, the back-surface support member BSM1 or BSM2 having partially thick portions and partially thin portions is formed. Due to such a constitution, the back-surface support members BSM1 or BSM2 is hardly bent in the direction along the beams 21 and is easily bent in the direction perpendicular to the beams 21 (in the lateral direction in FIG. 8 and FIG. 9).

Further, in addition to the formation of the beams on the back-surface support member on a side opposite to the display panel, as indicated by symbol 22 in FIG. 9, the beams may be also formed on the back-surface support member on a display-panel side at edge portions of the back-surface support member. Due to such a constitution, the back-surface support member can house the display panel, the backlight and the like therein.

Figure 10:
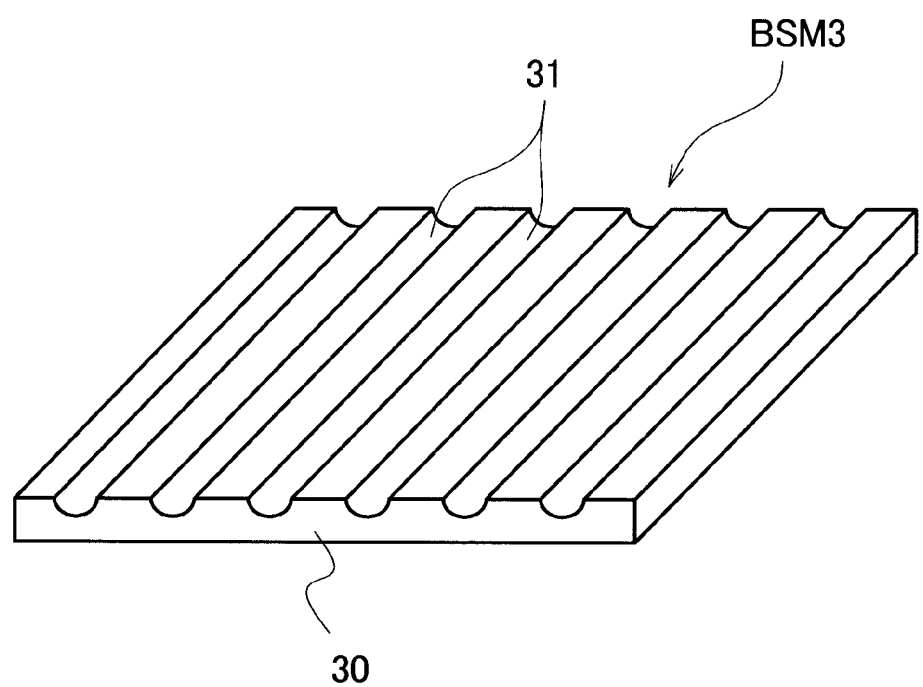
FIG. 10 is a perspective view for explaining an embodiment where a back surface support member possessing strength anisotropy due to a plurality of beams is used as a support member.

FIG. 10 shows a back-surface support member BSM3 where a plurality of grooves 31 are formed on the back-surface support member BSM3 parallel to two opposite sides of a display panel. With the formation of the grooves 31, a thickness of the plate member 30 which constitutes the back-surface support member is adjusted so that the plate member 30 is hardly bent in the direction along the grooves 31 and is easily bent in the direction perpendicular to the grooves 31 thus ensuring bending strength anisotropy. The grooves 31 may be formed either on a side of the back-surface support member BSM3 on which the display panel is held or on a side of the back-surface support member BSM3 opposite to the side of the back-surface support member BSM3 on which the display panel is held.

Figure 11:
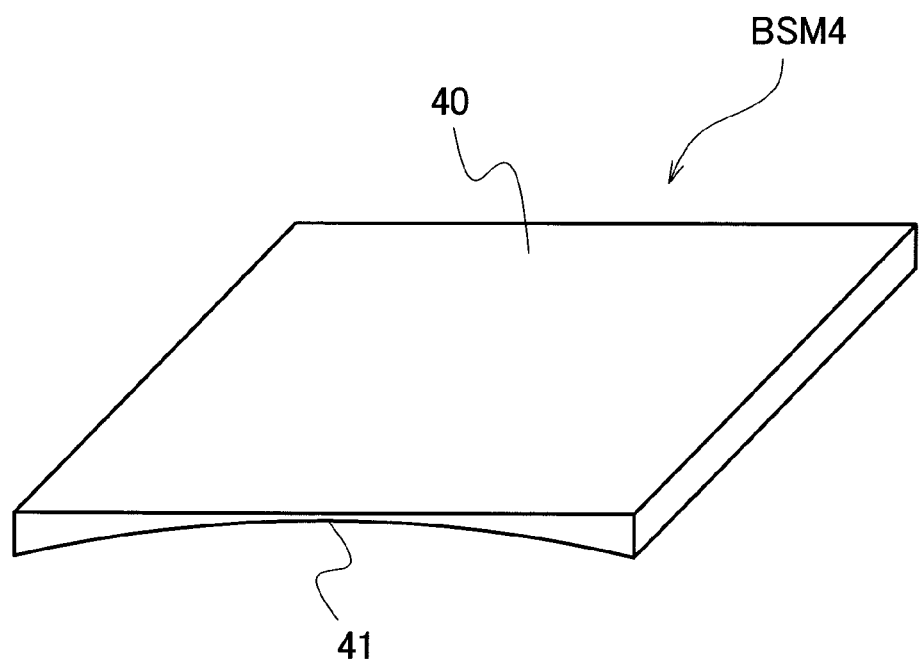
FIG. 11 is a perspective view for explaining an embodiment where a back surface support member possessing strength anisotropy due to the continuous curved structure formed by continuously changing a thickness of the back surface support member is used as a support member.

FIG. 11 shows a back-surface support member BSM4 on which a recessed portion 41 is formed by continuously changing a thickness of the back-surface support member BSM4 in the direction perpendicular to two opposite sides of the display panel. The recessed portion 41 is formed on a back surface of a back plate (on a side opposite to a side on which the display panel is arranged) such that a thickness of the recessed portion 41 is gradually and continuously changed. With the formation of the recessed portion 41, the back-surface support member BSM4 is hardly bent in the extending direction of the recessed portion 41 and is easily bent in the direction perpendicular to the recessed portion 41 (in the lateral direction in FIG. 11.)

By using the above-mentioned various kinds of support members, it is possible to impart strength anisotropy to the display panel. Accordingly, even when an external force is applied to the display panel which is supported by the support member, it is possible to encourage the display panel to be deformed one-dimensionally while suppressing the two-dimensional deformation of the display panel.

As has been explained heretofore, according to the present invention, even when the substrate which is brittle to two-dimensional deformation is used as the substrate which constitutes the display panel, it is possible to provide the display device which can suppress the breaking of the display panel.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a display panel in which a plurality of pixels are arranged on a substrate; and
    a support member which supports a lower surface of the display panel;
    wherein the display panel has a rectangular shape with first and second pairs of opposite sides;
    wherein the support member has a rectangular shape with two support lugs for supporting only one of the first and second pairs of the opposite sides of the lower surface of the display panel;
    wherein each of the two support lugs of the support member projects in a direction toward the lower surface of the display panel from one of two opposite sides of the support member, respectively, and each of the two support lugs is a continuous part of the support member extending from the one of the two opposite sides of the support member over a major portion of a respective opposite side of only one of the first and second pairs of the opposite sides of the lower surface of the display panel without extending over an entirety of the respective opposite side;
    wherein each of the two support lugs of the support member has a first surface portion, a second surface portion and a stepped portion disposed between the first and second surface portions so that the first and second surface portions extend in opposite directions away from the stepped portion;
    wherein the first surface portion is farther from the one of two opposite sides of the support member and closer to the lower surface of the display panel than that of the second surface portion; and
    wherein each of the two support lugs of the support member is disposed so as to directly support only one of the two opposite sides of only one of the first and second pairs of the opposite sides of the lower surface the display panel, respectively, which overlie the support lugs without directly supporting any portion of an other of the first and second pairs of the opposite sides of the lower surface of the display panel.

2. The display device according to claim 1, wherein the support member is a frame member having a portion which covers at least a part of the display panel.

3. The display device according to claim 2, wherein the frame member is provided with a folded portion which projects toward a side where the display panel is arranged at portions thereof outside positions where the two opposite sides of the lower surface of the display panel are supported.

4. The display device according to claim 1, wherein the support member is a casing member which houses the display panel, an optical sheet and a backlight member.

5. The display device according to claim 4, wherein the casing member includes a bottom surface, and two side surface support portions which are formed on edge portions of the bottom surface by being bent from the bottom surface such that the side surface support portions support two opposite sides of the display panel.

6. The display device according to claim 5, wherein a plurality of grooves which are arranged parallel to the side surface support portions are formed on the bottom surface of the casing member.

7. The display device according to claim 5 or 6, wherein a plurality of auxiliary support portions which are bent from the bottom surface and support portions of two other sides of the display panel different from said two opposite sides of the display panel are formed on the edge portions on a side where the side surface support portions are not formed out of the edge portions of the bottom surface.

8. The display device according to claim 1, wherein the support member has a support surface which overlaps with the display panel as viewed in a plan view, and
the support member is a back surface support member which supports a back surface of the display panel on a side opposite to a display screen of the display panel by the support surface.

9. The display device according to claim 2, wherein the display panel has a display screen which displays an image thereon, and
wherein the support member is an upper frame member having a portion which is disposed on the display screen.

10. The display device according to claim 1, wherein the two support lugs are bendable in a direction substantially perpendicular to a main surface of the display panel.

11. The display device according to claim 1, wherein the display panel is fixed to the two support lugs.

12. The display device according to claim 11, wherein the display panel is fixed to the two support lugs via an adhesive agent.

13. The display device according to claim 1, wherein the display panel has a first direction which extends between the two opposite sides of the display panel, and a second direction which is substantially perpendicular to the first direction,
wherein the display panel is more bendable in the second direction than the first direction.

14. The display device according to claim 13, wherein the display panel has a strength anisotropy which provides stronger one-dimensional deformation than two-dimensional deformation.

15. The display device according to claim 1, wherein the display panel has a strength anisotropy which provides stronger one-dimensional deformation than two-dimensional deformation.

16. A display device comprising:
a display panel in which a plurality of pixels are arranged on a substrate; and
a support member which supports a lower surface of the display panel;
wherein the display panel has a rectangular shape with first and second pairs of opposite sides;
wherein the support member has a rectangular shape with two support lugs for supporting only one of the first and second pairs of opposite sides of the lower surface of the display panel;
wherein each of the two support lugs of the support member projects in a direction toward the lower surface of the display panel from one of two opposite sides of the support member respectively, and each of the two support lugs is a continuous part of the support member extending from the one of the two opposite sides of the support member over a major portion of a respective opposite side of only one of the first and second pairs of the opposite sides of the lower surface of the display panel without extending over an entirety of the respective opposite side;
wherein each of the two support lugs has a first surface portion, a second surface portion and a stepped portion disposed between the first and second surface portions so that the first and second surface portions extend in opposite directions away from the stepped portion;
wherein the first surface portion is farther from the one of two opposite sides of the support member and closer to the lower surface of the display panel than that of the second surface portion;
wherein each of the two support lugs of the support member is disposed so as to directly support only one of the two opposite sides of only one of the first and second pairs of the opposite sides of the lower surface of the display panel, respectively, which overlie the support lugs without directly supporting any portion of an other of the first and second pairs of the opposite sides of the lower surface of the display panel;
wherein the display panel is fixed to the two support lugs via an adhesive agent;
wherein the stepped portion is formed such that the each of the two support lugs projects toward the display panel in a direction substantially parallel to the lower surface of the display panel and the stepped portion extends in a direction substantially perpendicular to the lower surface of the display panel; and
wherein the two support lugs are bendable in a direction substantially perpendicular to the lower surface of the display panel.

17. The display device according to claim 16, wherein the display panel has a first direction which extends between the two opposite sides of the display panel, and a second direction which is substantially perpendicular to the first direction,
wherein the display panel is more bendable in the second direction than the first direction.

18. The display device according to claim 16, wherein the display panel has a strength anisotropy which provides stronger one-dimensional deformation than two-dimensional deformation.

* * * * *